United States Patent
Romero et al.

[19]

[11] Patent Number: 5,915,463

[45] Date of Patent: *Jun. 29, 1999

[54] HEAT DISSIPATION APPARATUS AND METHOD

[75] Inventors: Guillermo L. Romero, Chandler; Tien-Yu T. Lee, Phoenix, both of Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/620,522

[22] Filed: Mar. 23, 1996

[51] Int. Cl.⁶ .................................................. H05K 7/20
[52] U.S. Cl. .................... 165/80.3; 165/80.4; 165/185; 174/16.3; 257/714; 361/699
[58] Field of Search .................. 165/80.3, 80.4, 165/185, 168; 174/16.3; 257/714, 721, 722; 361/690, 691, 692, 694, 697, 699, 702, 703, 704, 707, 713, 715, 716

[56] References Cited

U.S. PATENT DOCUMENTS

| | | | |
|---|---|---|---|
| 3,956,673 | 5/1976 | Seid | 165/170 X |
| 3,961,666 | 6/1976 | Suzuki et al. | 361/707 X |
| 4,103,737 | 8/1978 | Perkins | 361/704 X |
| 4,151,548 | 4/1979 | Klein et al. | 257/714 |
| 4,790,374 | 12/1988 | Jacoby | 165/185 |
| 4,802,532 | 2/1989 | Dawes et al. | 165/80.3 |
| 4,858,069 | 8/1989 | Hughes | 361/701 X |
| 4,979,074 | 12/1990 | Morley et al. | 361/720 |
| 5,022,462 | 6/1991 | Flint et al. | 165/80.4 |
| 5,107,397 | 4/1992 | Azar | 165/80.3 X |
| 5,218,516 | 6/1993 | Collins et al. | 361/715 X |
| 5,305,186 | 4/1994 | Appelt et al. | 361/704 |
| 5,313,098 | 5/1994 | Tumpey et al. | |
| 5,481,433 | 1/1996 | Carter | 361/690 |
| 5,526,231 | 6/1996 | Arz et al. | 361/707 |
| 5,666,269 | 9/1997 | Romero et al. | 361/699 |

FOREIGN PATENT DOCUMENTS

| 256348 | 9/1992 | Japan | 257/714 |
|---|---|---|---|
| 13972 | 1/1993 | Japan | 361/713 |

*Primary Examiner*—Leonard Leo
*Attorney, Agent, or Firm*—George C. Chen

[57] ABSTRACT

A heat dissipation apparatus (51) has a lid (12) and an optimized fin arrangement (16) located in a cavity (57) of a base (11). Semiconductor chips (41, 42, 43, 44, 45, and 46) are coupled to the lid (12), and a heat conducting medium (47) is forced into the cavity (57) through a port (13) and out of the cavity (57) through a different port (14). Heat generated by the semiconductor chips (41, 42, 43, 44, 45, and 46) is thermally conducted into the fin arrangement (16) and then transferred into the heat conducting medium (47).

20 Claims, 1 Drawing Sheet

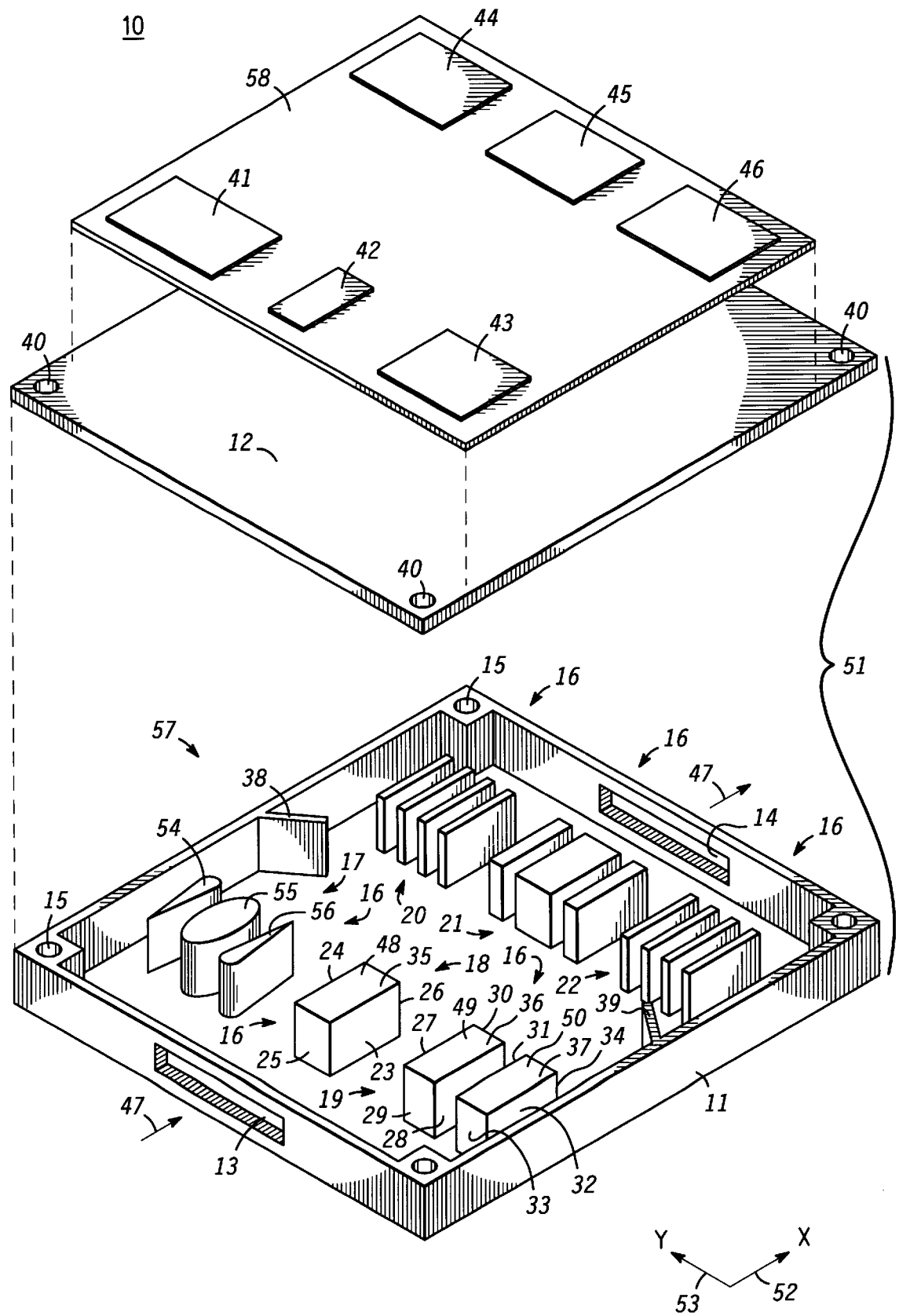

HEAT DISSIPATION APPARATUS AND METHOD

BACKGROUND OF THE INVENTION

This invention relates, in general, to heat dissipation, and more particularly, to heat dissipation for semiconductor devices.

Semiconductor devices used in high power applications such as, for example, industrial motor controls, power supplies, and electric vehicles require efficient thermal dissipation. One technique for providing efficient thermal dissipation uses a liquid cooling scheme wherein semiconductor devices are mounted onto a hollow heatsink through which a liquid flows. The heat generated by the semiconductor devices is conducted through the heatsink and into the flowing liquid, which is transported away from the semiconductor devices.

However, the heat distribution across the heatsink is non-uniform, wherein at least one of the semiconductor devices is typically at a much higher temperature than the other semiconductor devices. This non-uniform heat distribution accelerates thermal runaway problems and reduces the reliability of the semiconductor devices.

Accordingly, a need exists for an efficient thermal dissipation technique that provides substantially uniform heat distribution between semiconductor devices mounted on a heat dissipating apparatus.

BRIEF DESCRIPTION OF THE DRAWING

The single FIGURE illustrates an isometric view of an embodiment of a semiconductor device having a heat dissapation apparatus in accordance with the present invention.

DETAILED DESCRIPTION OF THE DRAWING

Turning to the single FIGURE for a more detailed description, the single FIGURE illustrates an isometric view of an embodiment of a semiconductor module 10 having a heat dissipation apparatus or heatsink 51. Heatsink 51 is comprised of heat conducting materials to facilitate effective heat transfer as described hereinafter. Heatsink 51 includes a base 11 and a lid 12 that have mounting holes 15 and 40, respectively, to mount semiconductor module 10 onto a mounting surface (not shown). Base 11 includes a channel or cavity 57, which couples an input port 13 to an output port 14. A fin arrangement 16 is located in cavity 57 between port 13 and port 14. Fin arrangement 16 can be a portion of base 11 or can be a separate workpiece subsequently attached to base 11 as discussed hereinafter.

Heatsink 51 can be formed by a variety of techniques. For example, two metal workpieces can welded or brazed together to form heatsink 51. In a preferred embodiment, heatsink 51 is formed from metal matrix composite (MMC) techniques, which strengthen heatsink 51 and hermetically seal base 11 and lid 12. For example, a silicon carbide powder is combined with binders to create a slurry that is molded into preforms for base 11 and lid 12, wherein fin arrangement 16 is integrated into base 11. The preforms are heated to burn away the binders, which forms porous preforms. Then, the porous preforms of base 11 and lid 12 are contacted together such that mounting holes 15 of base 11 are aligned with mounting holes 40 of lid 12.

While aligned together, the porous preforms of base 11 and lid 12 are simultaneously infiltrated with a molten aluminum alloy to create a hollow metal matrix composite structure. As known in the art, a molten aluminum alloy will flow or wick into a porous preform using a capillary motion. A larger fin arrangement 16 aids the aluminum alloy infiltration process, but fin arrangement 16 should not be so large that it significantly obstructs, retards, or impedes the flow of a heat conducting medium 47 in cavity 57 for reasons discussed herein. The aluminum alloy infiltration reinforces and strengthens base 11 and lid 12 and also creates a hermetic seal therebetween.

Fin arrangement 16 in cavity 57 guides heat conducting medium 47 in a path from port 13 to port 14. Heat conducting medium 47 can be a liquid or a gas such as, for example, water ($H_2O$) or steam ($H_2O$), respectively. At certain locations within cavity 57, heat conducting medium 47 travels along a y-axis 53 to move around portions of fin arrangement 16. However, the general or overall path of heat conducting medium 47 within cavity 57 substantially follows an x-axis 52, which is substantially perpendicular or normal to y-axis 53. It is understood that the overall path of heat conducting medium 47 can be a path other than a straight line depending upon a configuration of fin arrangement 16 and cavity 57.

In the illustrated embodiment, fin arrangement 16 has fin structures 17, 18, 19, 20, 21, and 22. Port 13 is located closer to fin structure 18 compared to fin structures 17 or 19, and port 14 is located closer to fin structure 21 compared to fin structures 20 or 22.

Fin structure 18 is comprised of a single fin 48, which has sidewall surfaces 23 and 24, front surface 25, back surface 26, and a top surface 35. A sidewall surface area for fin structure 18 is comprised of sidewalls surfaces 23 and 24, which are substantially parallel to the overall flow of heat conducting medium 47 in cavity 57. Front and back surfaces 25 and 26, respectively, are substantially perpendicular or normal to the overall flow of heat conductive medium 47 within cavity 57 and are preferably not part of the sidewall surface area of fin structure 18 for reasons discussed hereinafter.

Fin structure 19 is comprised of a plurality of fins, namely fins 49 and 50. Fin 49 has sidewall surfaces 27 and 28, front surface 29, back surface 30, and a top surface 36, and fin 50 has sidewall surfaces 31 and 32, front surface 33, back surface 34, and a top surface 37. Consequently, fin structure 19 has a top surface comprised of top surfaces 36 and 37. A sidewall surface area for fin structure 19 is comprised of sidewall surfaces 27, 28, 31, and 32, which are substantially parallel to the overall flow of heat conducting medium 47 in cavity 57. Front surfaces 29 and 33, and back surfaces 30 and 34 are substantially perpendicular or normal to the overall flow of heat conductive medium 47 in cavity 57 and are preferably not part of the sidewall surface area of fin structure 19 for reasons discussed hereinafter.

Each of fin structures 17, 20, 21, and 22 have a top surface and also have sidewalls surfaces forming a sidewall surface area that are similar to that of fin structures 18 and 19. Each of fin structures 17, 18, 19, 20, 21, and 22 are preferably as tall as cavity 57 is deep. Thus, when heatsink 51 is assembled with lid 12 coupled to base 11, the top surfaces of fin structures 17, 18, 19, 20, 21, and 22 contact lid 12.

Semiconductor chips 41, 42, 43, 44, 45, and 46 are coupled to an isolation layer 58 using coupling techniques known in the art. Semiconductor chips 41, 42, 43, 44, 45, and 46 are comprised of a semiconductor material including, but not limited to, silicon or gallium arsenide, and are manufactured using semiconductor processing techniques known to those skilled in the art. Semiconductor chips 41, 42, 43, 44, 45, and 46 are either packaged or unpackaged semiconductor chips.

Isolation layer 58 is coupled to lid 12 and is comprised of an electrically isolating and heat conducting material such as, for example, aluminum oxide or beryllium oxide. Isolation layer 58 is aligned to heatsink 51 such that semiconductor chips 41, 42, 43, 44, 45, and 46 are positioned above fin structures, 17, 18, 19, 20, 21, and 22, respectively. Isolation layer 58 can be coupled or attached to heatsink 51 during the aluminum alloy infiltration process in order to eliminate the need for an extra metallization or soldering step. The compositions of isolation layer 58 and heatsink 51 and the method of coupling isolation layer 58 and heatsink 51 should minimize the problems associated with thermal expansion coefficient mismatches between isolation layer 58 and heatsink 51.

During operation, each of semiconductor chips 41, 42, 43, 44, 45, and 46 generate heat, which is efficiently and uniformly dissipated by heatsink 51 such that the temperature difference between each of semiconductor chips 41, 42, 43, 44, 45, and 46 is minimized. To improve the reliability and to reduce the stress of semiconductor module 10, heatsink 51 preferably enables semiconductor chips 41, 42, 43, 44, 45, and 46 and fin structures 17, 18, 19, 20, 21, and 22 to be cooled to less than approximately 115 degrees Celsius (° C.), to be at approximately equal temperatures, or to be within approximately 5° C. of each other.

Because semiconductor chips 41, 42, 43, 44, 45, and 46 overlie fin structures 17, 18, 19, 20, 21, and 22, respectively, the heat generated by each of semiconductor chips 41, 42, 43, 44, 45, and 46 is conducted through an underlying portion of isolation layer 58, through an underlying portion of lid 12, and into the top surfaces of fin structures 17, 18, 19, 20, 21, and 22, respectively. As heat conducting medium 47 travels into port 13 and through cavity 57, heat conducting medium 47 contacts fin structures 17, 18, 19, 20, 21, and 22. The heat in fin structures 17, 18, 19, 20, 21, and 22 is dissipated through their respective sidewall surfaces and into heat conducting medium 47. Then, the heat conducting medium 47 is then forced out of cavity 57 through port 14. Thus, heat is effectively dissipated from semiconductor chips 41, 42, 43, 44, 45 and 46, which preferably remain at a temperature below approximately 115° C. for improved reliability and lower stress.

The optimum flow rate and temperature for heat conducting medium 47 is dependent upon the specific geometry of cavity 57. As an example of the previously described convection process for heatsink 51, heat conducting medium 47 is forced into cavity 57 at a rate of approximately 300–600 liters per hour. At port 13, heat conducting medium 47 can have a temperature of approximately 40–50° C. The temperature of heat conducting medium 47 increases as heat conducting medium 47 travels through cavity 57 and absorbs the heat out of fin arrangement 16. Preferably, the temperature of heat conducting medium 47 does not increase beyond approximately 10–20° C. in order to maintain efficient thermal transfer efficiency between heat conducting medium 47 and fin arrangement 16. A high flow rate can reduce the magnitude of temperature increase for heat conducting medium 47.

While the overall flow rate of heat conducting medium 47 is preferably substantially constant from port 13 to port 14, the local flow rate of heat conducting medium 47 may vary within cavity 57 due to the relative locations or positions of port 13, port 14, and fin arrangement 16. For instance, the local flow rate of heat conducting medium 47 is higher in the proximity of fin structure 18 compared to the proximity of fin structures 17 or 19 because port 13 is closer to fin structure 18 than fin structures 17 or 19. Similarly, the local flow rate of heat conducting medium 47 is higher in the proximity of fin structure 21 compared to the proximity fin structures 20 or 22 because port 14 is closer to fin structure 21 than fin structures 20 or 22.

For a given sidewall surface area of a fin structure and for a given cross-sectional area through which heat conducting medium 47 flows, the heat transfer rate from the fin structure to heat conducting medium 47 is proportional to the local flow rate of heat conducting medium 47. However, for a given local flow rate of heat conducting medium 47 and for a given cross-sectional area through which heat conducting medium 47 flows, the heat transfer rate is proportional to the sidewall surface area of a fin structure. Therefore, to balance the heat transfer rate and to uniformly distribute the heat across heatsink 51 and semiconductor chips 41, 42, 43, 44, 45, and 46, the sidewall surface areas of fin structures 17 and 19 are larger than the sidewall surface area of fin structure 18 to compensate for the lower local flow rates of heat conducting medium 47 around fin structures 17 and 19 compared to fin structure 18. Similarly, the sidewall surface areas of fin structures 20 and 22 are larger than the sidewall surface area of fin structure 21 to compensate for the lower local flow rate of heat conducting medium 47 around fin structures 20 and 22 compared to fin structure 21.

Computer simulations have shown that the front and back surfaces of a fin structure or the surfaces of a fin structure that are substantially perpendicular to the overall flow of heat conducting medium 47 do not significantly contribute to the dissipation of heat from the fin structure. Accordingly, the surface areas of the front and back surfaces of fin arrangement 16 are preferably not part of the sidewall surface areas.

Furthermore, if heat conducting medium 47 is pumped into port 13, the temperature of heat conducting medium 47 will be lower near fin structures 17, 18, and 19 compared to fin structures 20, 21, and 22, respectively. The temperature change of heat conducting medium 47 within cavity 57 is due to the heat transfer from fin arrangement 16 into heat conducting medium 47. Heat from fin structures 17, 18, and 19 raise the temperature of heat conducting medium 47 before heat conducting medium 47 reaches fin structures 20, 21, and 22. The higher temperature of heat conducting medium 47 decreases the heat transfer efficiency from fin structure 16 to heat conducting medium 47. Therefore, as depicted in the single FIGURE, the sidewall surface areas of fin structures 20, 21, and 22 are greater than the sidewall surface areas of fin structures 17, 18, and 19, respectively, to compensate for the higher temperature of heat conducting medium 47 in the vicinity of fin structures 20, 21, and 22 compared to the vicinity of fin structures 17, 18, and 19, respectively.

If heat conducting medium 47 is conducted from port 14 to port 13, the temperature of heat conducting medium is higher near fin structures 17, 18, and 19 compared to fin structures 20, 21, and 22, respectively, because fin structures 17, 18, and 19 are downstream from fin structures 20, 21, and 22, respectively. Thus, in this undepicted example, fin structures 20, 21, and 22 would have smaller sidewall surface areas than fin structures 17, 18, and 19, respectively, to balance the heat distribution across semiconductor module 10.

Computer simulations have also shown that most of the heat created by semiconductor chips 41, 42, 43, 44, 45, and 46 is conducted vertically through isolation layer 58, through lid 12, and into fin arrangement 16. A negligible portion of the heat is conducted across isolation layer 58 or lid 12 in a direction substantially parallel to the overall flow of heat conducting medium 47 in cavity 57. Therefore, fin structures 17, 18, 19, 20, 21, and 22, are preferably the same size as semiconductor chips 41, 42, 43, 44, 45, and 46, respectively, in order to optimize the heat transfer efficiency and the compactness of heatsink 51 and semiconductor module 10.

However, some of the heat is conducted across isolation layer 58 or lid 12 in a direction substantially perpendicular to the overall flow of heat conducting medium 47 in cavity 57. Therefore, to improve the heat transfer efficiency, fin structures 17, 18, 19, 20, 21, and 22 can be wider than semiconductor chips 44, 45, 43, 44, 45, and 46, respectively, in a direction substantially perpendicular to the overall flow of heat conducting medium 47 in cavity 57.

To further improve the heat transfer efficiency of semiconductor module 10, the individual fins of fin arrangement 16 can have an oblong shape that eliminates the front and back surfaces of a fin while elongating the sidewall surfaces of a fin. As an example, fin structure 17 is comprised of individual fins 54, 55, and 56, each of which has a different oblong shape that increases the sidewall surface area of fin structure 17.

Fin arrangement 16 optionally includes deflection or guidance fins 38 and 39, which are positioned to help direct the flow of heat conducting medium 47 in cavity 57. Also mentioned previously, the local flow rate of heat conducting medium 47 is lower at fin structures 20 and 22 compared to fin structure 21 due to the location of port 14. Accordingly, guidance fins 38 and 39 are positioned or located adjacent to fin structures 20 and 22, respectively, to help increase the flow rate near or around fin structures 20 and 22. Because guidance fins 38 and 39 are positioned away from a semiconductor chip, guidance fins 38 and 39 are substantially devoid of heat transfer between semiconductor chips 41, 42, 43, 44, 45, and 46 and heat conducting medium 47.

Fin arrangement 16 is not restricted or limited to the illustrated embodiment portrayed in the single FIGURE. It is understood that various other embodiments of fin arrangement 16 can be employed to effectively dissipate heat across heatsink 51. For example, heatsink 51 can utilize a plurality of ports, which can reduce the number of differently sized and shaped fin structures and guidance fins.

Therefore, in accordance with the present invention, it is apparent there has been provided an improved heat dissipation apparatus that overcomes the disadvantages of the prior art. The present invention substantially eliminates irregular or non-uniform heat dissipation across a heatsink. Thus, the present invention reduces or alleviates reliability problems and stress problems associated with thermal runaway. The present invention provides uniform heat dissipation by increasing the surface area of the sidewalls of fin structures to compensate for reduced flow rates of a heat conducting medium.

While the invention has been particularly shown and described with reference to preferred embodiments, it will be understood by those skilled in the art that changes in form and detail may be made without departing from the spirit and scope of the invention. For instance, heatsink 51 can have semiconductor chips mounted on a surface of base 11 opposite lid 12. Accordingly, the disclosure of the present invention is intended to be illustrative, but not limiting, of the scope of the invention, which is set forth in the following claims.

We claim:

1. A heat dissipation apparatus comprising:
   a lid;
   a base underlying the lid, the lid and the base forming a cavity, the base having an input port, an output port, and further comprising:
      a first fin structure having a first sidewall surface area, physically contacting the lid, and located in the cavity and adjacent to the input port; and
      a second fin structure having a second sidewall surface area, physically contacting the lid, and located in the cavity and adjacent to the output port, wherein the second sidewall surface area is greater than the first sidewall surface area, and wherein the first and second fin structures are approximately the same height;
   a first semiconductor chip overlying the lid and overlying and thermally coupled to the first fin structure;
   a second semiconductor chip overlying the lid and overlying and thermally coupled to the second fin structure; and
   a guidance fin located in the cavity, wherein the guidance fin is substantially devoid of heat transfer from the first and second semiconductor chips.

2. The heat dissipation apparatus according to claim 1 wherein the first and second fin structures are integrated into the base.

3. The heat dissipation apparatus according to claim 1 wherein the first fin structure is wider than the first semiconductor chip.

4. The heat dissipation apparatus according to claim 1 wherein a temperature of the first semiconductor chip and a temperature of the second semiconductor chip are substantially equal.

5. The heat dissipation apparatus according to claim 1 wherein the lid and the base are comprised of a metal matrix composite.

6. A semiconductor module comprising:
   a lid;
   a base underlying the lid, the lid and the base forming a cavity, the base having an input port, an output port, and further comprising:
      a first fin structure having a first sidewall surface area and located in the cavity and adjacent to the input port; and
      a second fin structure having a second sidewall surface area and located in the cavity and adjacent to the output port, wherein the second sidewall surface area is greater than the first sidewall surface area, and wherein the input port and output port form a first axis;
   a first semiconductor chip overlying the lid and overlying and thermally coupled to the first fin structure;
   a second semiconductor chip overlying the lid and overlying and thermally coupled to the second fin structure; and
   a third fin structure located in the cavity and located adjacent to the first fin structure, the input port located closer to the third fin structure than the first fin structure, the third fin structure having a third sidewall surface area less than the first sidewall surface area, an the first and third fin structures forming a second axis non-parallel to the first axis.

7. The semiconductor module of claim 6 wherein the second axis is approximately perpendicular to the first axis.

8. The semiconductor module of claim 7 wherein the second and third fin structures form a third axis approximately parallel to the first axis.

9. The semiconductor module of claim 6 further comprising a guidance fin located in the cavity, wherein the guidance fin is substantially devoid of heat transfer from the first and second semiconductor chips.

10. The semiconductor module of claim 6 further comprising a fourth fin structure located in the cavity and located adjacent to the second fin structure, the output port located closer to the second fin structure than the fourth fin structure, the fourth fin structure having a fourth sidewall surface area greater than the first, second, and third sidewall surface areas, wherein the second and fourth fin structures form a third axis non-parallel to the first axis.

11. The semiconductor module of claim 6 wherein the first, second, and third fin structures are approximately the same height.

12. The semiconductor module of claim 11 wherein the first, second, and third fin structures physically contact the lid.

13. A heat dissipation apparatus comprising:

a lid;

a base underlying the lid, the lid and the base forming a cavity, the base having an input port, an output port, and further comprising:
  a first fin structure having a first sidewall surface area and located in the cavity and adjacent to the input port; and
  a second fin structure having a second sidewall surface area and located in the cavity and adjacent to the output port, wherein the second sidewall surface area is greater than the first sidewall surface area, and wherein the first and second fin structures are approximately the same height;

a first semiconductor chip overlying the lid and overlying and thermally coupled to the first fin structure;

a second semiconductor chip overlying the lid and overlying and thermally coupled to the second fin structure; and a third fin structure located in the cavity and located adjacent to the second fin structure, the output port located closer to the second fin structure than the third fin structure, the third fin structure having a third sidewall surface area greater than the second sidewall surface area and greater than the first sidewall surface area.

14. The semiconductor module of claim 13 further comprising a guidance fin located in the cavity, wherein the guidance fin is substantially devoid of heat transfer from the first and second semiconductor chips.

15. A heat dissipation apparatus comprising:

a lid; and a base coupled to the lid, the base having a cavity and further comprising:
  a first port;
  a second port, wherein the cavity couples the first port and the second port;
  a first fin structure having a first sidewall surface area and located in the cavity and adjacent to the first port;
  a second fin structure having a second sidewall surface area and located in the cavity and adjacent to the second port, wherein the second sidewall surface area is greater than the first sidewall surface area;

a first semiconductor chip thermally coupled to and overlying the first fin structure so that heat from the first semiconductor chip is transferred to the first fin structure;

a second semiconductor chip thermally coupled to and overlying the second fin structure so that heat from the second semiconductor chip is transferred to the second fin structure; and a guidance fin located in the cavity, wherein the guidance fin is substantially devoid of heat transfer from the first and second semiconductor chips.

16. A semiconductor module comprising:

a first semiconductor chip;

a second semiconductor chip; and a heatsink underlying the first and second semiconductor chips, the heatsink having a cavity with a height and coupling a first port and a second port and further comprised of:
  a first fin structure located in the cavity, located underneath and thermally coupled to the first semiconductor chip, having a first sidewall surface area, having the height of the cavity, and having a first top surface;
  a second fin structure located in the cavity, located underneath and thermally coupled to the second semiconductor chip, having a second sidewall surface area less than the first sidewall surface area, having the height of the cavity, and having a second top surface, the first and second fin structures having approximately equal heights; and a guidance fin located in the cavity, wherein the guidance fin is substantially devoid of heat transfer from the first and second semiconductor chips.

17. The semiconductor module according to claim 16 wherein the first fin structure is comprised of a plurality of fins, each of the plurality of fins having a top surface and a sidewall surface area, wherein the first sidewall surface area is comprised of the sidewall surface areas of the plurality of fins, and wherein the first top surface is comprised of the top surfaces of the plurality of fins.

18. The semiconductor module according to claim 16 further comprising a heat conducting medium flowing into the first port, through the cavity, and out of the second port, wherein the first and second sidewall surface areas are approximately parallel to an overall path of the heat conducting medium flowing through the cavity, wherein heat generated by the first semiconductor chip is dissipated from the first semiconductor chip into the first top surface, out of the first sidewall surface area, and into the heat conducting medium, and wherein heat generated by the second semiconductor chip is dissipated from the second semiconductor chip into the second top surface, out of the second sidewall surface area, and into the heat conducting medium.

19. The semiconductor module according to claim 16 wherein a difference in temperature between the first fin structure and the second fin structure is less than approximately five degrees Celcius.

20. The semiconductor module according to claim 16 wherein the heatsink is comprised of a hollow metal matrix composite structure.

* * * * *

UNITED STATES PATENT AND TRADEMARK OFFICE
CERTIFICATE OF CORRECTION

PATENT NO. : 5,915,463
DATED : June 29, 1999
INVENTOR(S) : Guillermo L. Romero, Tien-Yu T. Lee It is certified that error appears in the above-identified patent and that said Letters Patent is hereby corrected as shown below:

Column 6, claim 6,
Line 61, delete "an" and replace with -- and --.

Column 8, claim 19,
Line 57, delete "Celcius" and replace with -- Celsius --.

Signed and Sealed this

Twenty-sixth Day of March, 2002

Attest:

JAMES E. ROGAN
Attesting Officer  Director of the United States Patent and Trademark Office